United States Patent
Kawamura et al.

(10) Patent No.: US 7,205,034 B2
(45) Date of Patent: Apr. 17, 2007

(54) METHOD AND DEVICE FOR GENERATING UNIFORM HIGH-FREQUENCY PLASMA OVER LARGE SURFACE AREA USED FOR PLASMA CHEMICAL VAPOR DEPOSITION APPARATUS

(75) Inventors: Keisuke Kawamura, Nagasaki (JP); Akemi Takano, Nagasaki (JP); Hiroshi Mashima, Nagasaki (JP); Hiromu Takatuka, Nagasaki (JP); Yasuhiro Yamauti, Nagasaki (JP); Yoshiaki Takeuchi, Nagasaki (JP); Eishiro Sasakawa, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/494,528

(22) PCT Filed: Oct. 29, 2002

(86) PCT No.: PCT/JP02/11208

§ 371 (c)(1),
(2), (4) Date: May 27, 2005

(87) PCT Pub. No.: WO2004/040629

PCT Pub. Date: May 13, 2004

(65) Prior Publication Data

US 2005/0255255 A1    Nov. 17, 2005

(51) Int. Cl.
*H05H 1/24* (2006.01)
(52) U.S. Cl. ............ 427/569; 118/723 R; 118/723 MP
(58) Field of Classification Search ................. 427/569; 118/723 R, 723 MP
See application file for complete search history.

(56) References Cited

U.S. PATENT DOCUMENTS

| 6,245,690 | B1 * | 6/2001 | Yau et al. ................... 438/780 |
| 6,456,010 | B2 * | 9/2002 | Yamakoshi et al. ..... 315/111.21 |
| 6,755,150 | B2 * | 6/2004 | Lai et al. .................. 118/723 I |
| 2001/0021422 | A1 * | 9/2001 | Yamakoshi et al. ......... 427/569 |
| 2003/0164225 | A1 * | 9/2003 | Sawayama et al. .... 156/345.29 |
| 2005/0223990 | A1 * | 10/2005 | Kawamura et al. ...... 118/723 E |

FOREIGN PATENT DOCUMENTS

| JP | 11-111622 | 4/1999 |
| JP | 2989279 | 10/1999 |
| JP | 2000-3878 | 1/2000 |
| JP | 2000-58465 | 2/2000 |
| JP | 2000-323297 | 11/2000 |
| JP | 2001-7028 | 1/2001 |
| JP | 2002-43225 | 2/2002 |
| JP | 2002-322563 | * 11/2002 |
| WO | 00/79844 | 12/2000 |

* cited by examiner

*Primary Examiner*—Bret Chen
(74) *Attorney, Agent, or Firm*—Oblon, Spivak, McClelland, Maier & Neustadt, P.C.

(57) ABSTRACT

A plasma generation device for generating plasma uniformly over a large surface area by very high frequency (VHF), which is installed in a plasma chemical vapor deposition apparatus. A first and a second power supply section are installed on both ends of the discharge electrode installed in a plasma chemical vapor deposition apparatus, and are supplied with alternate cycles: the first cycle wherein the first and second power supply sections receive high frequency waves at the same frequency, and a second cycle wherein different high frequency waves are received. In this manner, the state of plasma generation may be varied in each cycle, and when averaged over time, it makes possible uniform plasma generation over a large surface area.

19 Claims, 6 Drawing Sheets

FIG. 2
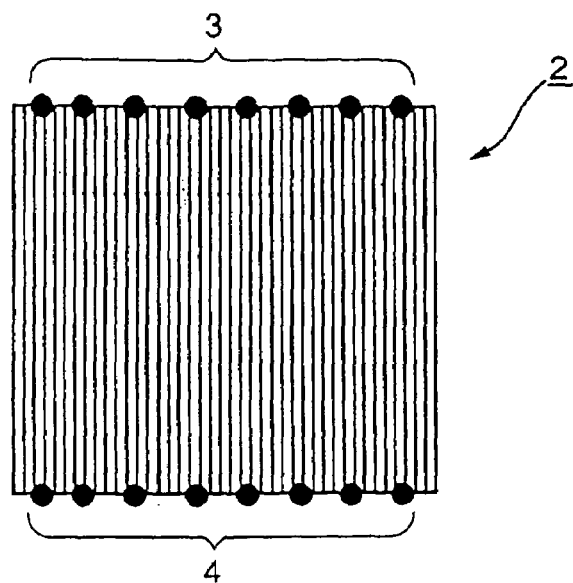
12: High Frequency Power Source A
13: High Frequency Power Source B    FIG. 3
23: DC Bias
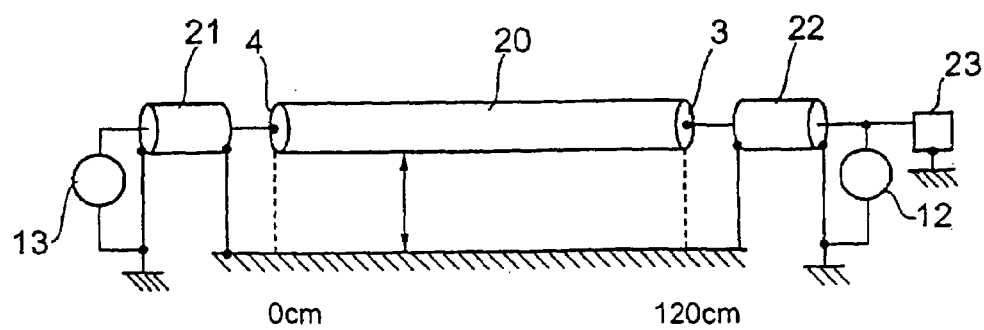

METHOD AND DEVICE FOR GENERATING UNIFORM HIGH-FREQUENCY PLASMA OVER LARGE SURFACE AREA USED FOR PLASMA CHEMICAL VAPOR DEPOSITION APPARATUS

FIELD OF THE INVENTION

The present invention relates to a method and device for generating uniform high-frequency plasma over a large surface area used for a plasma chemical vapor deposition apparatus. The plasma chemical vapor deposition apparatus is used for forming or etching the semiconductor films from amorphous silicon, microcrystal silicon, multicrystal thin films silicon, silicon nitride, etc. for use in solar cells, thin film transistors or the like, and used for performing fluorine radical cleaning (self-cleaning) which cleans the amorphous silicon (a-Si) deposits inside the film-forming chamber using $NF_3$ gas plasma.

TECHNICAL BACKGROUND

A high frequency plasma generator device used in a plasma chemical vapor deposition apparatus performs forming or etching the semiconductor films from amorphous silicon (hereinafter abbreviated "a-Si"), microcrystal silicon, multicrystal thin films silicon, silicon nitride, etc. for use in solar cells, thin film transistors or the like, and performs self-cleaning for the silicon deposits in the film forming chamber using $NF_3$ gas. The high frequency plasma generator device may employ one of two types of electrodes: a parallel flat plate type electrode or a ladder type electrode.

FIG. 6 illustrates an example of a device employing the parallel flat plate type electrode. Substrate heating support means 6 is installed inside of the plasma chemical vapor deposition apparatus 1 and contacts to the ground electrically. Flat plate electrode 60 is separated, for example, by 20 mm from the opposing substrate heating support means 6. The flat plate electrode 60 is connected to an external high frequency power source 61 via an impedance matching controller 62 and coaxial cable 63. In addition, ground seal 5 prevents the generation of unwanted plasma on the side opposite from the side facing the substrate heating support means 6.

Then, substrate 7 for the a-Si film forming is placed atop the substrate heating support means 6 at a set temperature, for example, of 200° C.; silane gas ($SiH_4$) is introduced via the gas inlet pipe 64 at a flow velocity, for example, of 50 sccm; and a vacuum pump (not shown) connected to vacuum exhaust pipe 65 is operated to adjust the exhaust flow rate, and resultingly, the inside pressure in the plasma chemical vapor deposition apparatus 1 is set, for example, to 100 mTorr. Then, the plasma 66 is generated between substrate 7 and the flat plate electrode 60 by supplying high frequency power from the high frequency power source 61, which is adjusted by the impedance matching controller 62, to create highly efficient plasma generation in the plasma generator device. Inside of plasma 66, the $SiH_4$ breaks down and an a-Si film is formed on the surface of the substrate 7. An adequate thickness of a-Si film may be deposited in this manner over the course of approximately 10 minutes.

An example of a ladder type of high frequency plasma generator device structure is shown in FIG. 7; FIG. 8 shows a diagram from the A-direction in FIG. 7 to further elucidate the structure of the ladder-type electrode 70. The structure of such ladder-type electrodes 70 is described in detail in Japanese Patent Publication Hei 4-236781, etc., while Japanese Patent Publication Hei 11-111622 discloses an evolved form of the ladder-type electrode in which a plurality of parallel electrode rods are arrayed into an electrode group, and where two such groups are arrayed orthogonally to form an electrode mesh.

In the high frequency plasma generator device shown in FIG. 7, substrate heating support means 6 (not shown in FIG. 8) is electrically connected to the ground, which is provided inside of the plasma chemical vapor deposition apparatus, and ladder-type electrode 70 is positioned opposite to the substrate heating support means 6 at a distance, for example, of 20 mm. The ladder-type electrode 70 is electrically connected to an external high frequency power source 61 via impedance matching controller 62 and coaxial cable 63. Ground shield 5 is positioned to prevent unwanted plasma from being generated on the side opposite the surface facing substrate heating support means 6.

Then, substrate 7 for the a-Si film forming is placed atop the substrate heating support means 6 at a set temperature, for example, of 200° C., and silane gas ($SiH_4$) is introduced via the gas inlet pipe at a flow velocity, for example, of 50 sccm. Then a vacuum pump (not shown) connected to vacuum exhaust pipe is operated to adjust the exhaust flow rate, and resultingly, the inside pressure in the plasma chemical vapor deposition apparatus 1 is set, for example, to 100 mTorr. Since the plasma 71 is generated between substrate 7 and the ladder-type electrode 70 by supplying high frequency power to the ladder-type electrode 70, the impedance matching controller 62 can be adjusted to create highly efficient plasma generation in the plasma generator device. Inside of plasma 71, then, the silane ($SiH_4$) breaks down and an a-Si film is formed on the surface of the substrate 7. Thus an adequate thickness of a-Si film may be deposited in this manner over the course of approximately 10 minutes.

Comparing the structural example of FIG. 7 to that of FIG. 6, first, the use of a ladder-type electrode comprised of a plurality of rods having a round cross section rather than a flat plate electrode, allows the silane ($SiH_4$) raw material to flow freely between the rungs to make the supply of the raw material more uniform. Second, the plasma can be generated more uniformly by means of the plurality of power supply points (in this example 4 points), as opposed to one supply point.

Such plasma chemical vapor deposition apparatus include a high frequency plasma generator device, but there is an ongoing demand for devices that can fabricate thin film semiconductors for solar cells, thin film transistors for flat panel displays and the like, in low cost by manufacturing a large surface area (e.g. approximately 1.5×1.2 m) at high speed, and in high quality by lowering the defect density and achieving the high level crystallization rate. Additionally, a demand exists for high speed, large surface area self-cleaning using $NF_3$ gas of the a-Si deposits that accumulate in the chambers where the large surface area film forming takes place, which is the same demand for fabricating thin films.

To meet such demands, very higher frequency power sources (30–800 MHz) have been used for a new plasma generation method. The use of the foregoing very higher frequencies speeds up the film forming rate and produces higher quality. The method is described, for example, in "Mat. Res. Soc. Symp. Proc., Vol. 424, pp-9, 1997. Recently, attention has been focused upon forming microcrystal Si thin films in place of a-Si films using such very higher frequencies to produce high speed, high quality films.

One problem with these very high frequency film forming methods is the difficulty of obtaining uniformity in large surface area film forming. Since the wavelength of these very high frequencies is on the same order as the electrode size, a standing wave is generated at the ends of the electrodes due to reflected waves causing a floating inductance capacitance that affects the voltage distribution, which in turn causes nonuniformity in the plasma distribution due to the interference between the plasma and the high frequency waves. The result is a nonuniform distribution of the film thickness, with the film being thinner in the center. Further, the $NF_3$ plasma used in self-cleaning, being a negatively charged gas (electrons adhere easily), causes the plasma itself to be very unstable, and in addition its distribution is nonuniform due to the gas flow (the plasma being generated on the downstream side) and differences in the distance between electrodes.

In a typical example employing the parallel flat plate electrode that is structurally depicted in FIG. 6, the electrode size exceeds 30 cm×30 cm. Thus, when the frequency exceeds 30 MHz, the above described effects become pronounced and it is difficult to achieve even the minimal uniformity in film thickness of ±10% for manufacturing the semiconductor film.

On the other hand, in a typical example with a ladder-type electrode structured as shown in FIGS. 7, 8, the pronounced standing wave that forms from the single point of power supply is characteristically reduced by using four power supply points. However, in this case as well, it becomes difficult to form uniform films when the electrode size exceeds 30 cm or when the frequency exceeds 80 MHz.

The above-described problems have drawn the attention of academic societies, and at this point, as described in Mat. Res. Soc. Symp. Proc., Vol. 377, pp. 27, 1995, for example, proposals were made to connect a no-loss reactance (coil) to the side opposite the power supply side of the parallel flat plate electrode. This changes the reflected wave conditions for the standing wave at the end of the electrode and generates a relatively flat distribution of standing wave waveforms, for example, a sine wave peak over the electrode that thereby decreases the voltage distribution from the electrode. However, this method does not fundamentally eliminate standing waves, but merely generates the flat part of a sine wave over the electrode, which produces a uniform area which is approximately ⅛ of that wavelength. In theory, further uniformization beyond that range would not be possible.

Other proposals for technology to generate uniform plasma over a large surface area is disclosed in Japanese Patent publications 2000-3878, 2000-58465, 2000-323297, 2001-7028, etc., but in these, the maximum electrode size was about 80 cm×80 cm. They cannot accommodate the large surface areas of 1.5 m×1.2 m that are targeted by the present invention. Thus, the conventional technology for plasma chemical vapor deposition apparatus that perform very high frequency plasma generation could not generate plasma to produce a uniform film upon very large substrates that exceed 1 m×1 m in size.

Technology similar to that used in the present invention, that is technology that uses two different discharge electrodes supplied two different high frequency waves is described in detail in, M. Noisan, J. Pelletier, ed., "Microwave Excited Plasmas," Technology, 4, second impression, pp. 401, Elsevier Science B. V., 1999.

However the objective of that technology was to control the volume of active ions and other inflow as well as the irradiated energy by means of using the one high frequency wave for plasma generation and the other to control the bias voltage on the surface of the dielectric substrate. That objective differs completely from the objective of the present invention of producing uniform plasma generation over an exceeding large substrate of 1 m×1 m.

The present invention was developed to resolve the aforementioned problems and has as its objective, the provision of a uniformization method and device for high frequency plasma over large surface areas, by employing a plasma chemical vapor deposition apparatus that generates uniform plasma over a large surface area using a very high frequency (VHF) plasma chemical vapor deposition apparatus.

SUMMARY OF THE INVENTION

To resolve the foregoing problems, the present invention installs a first and a second power supply section on both ends of the discharge electrode, which are supplied with alternate cycles: the first cycle wherein the first and second power supply sections receive high frequency waves at the same frequency, and a second cycle wherein different high frequency waves are received, whereby the standing waves generated in each cycle form in different positions during the plasma generation, which, when averaged over time, makes possible uniform plasma generation over a large surface area.

To wit, the present invention relates a plasma generation method for generating high frequency plasma uniformly over a large surface area in a plasma chemical vapor deposition apparatus in which the plasma is generated by supplying high frequency power to a discharge electrode. It may comprise the steps of: applying a first cycle of high frequency power supply to a first and a second power supply section being installed on both ends of a discharge electrode, wherein each high frequency power to the first and the second power supply sections have the same frequency; and applying a second cycle of high frequency power supply to the first and the second power supply sections wherein each high frequency power have different frequencies; wherein the first and the second cycles are alternatively switched to apply the same frequency or the different frequencies to the first and the second power supply sections continuously, so as to generate a different plasma by changing a generation position of standing wave in each cycle, but a uniform plasma over large surface areas when averaged over time.

In addition, the present invention provides a device to implement the effects of the present invention. This invention relates a plasma generation device for generating high frequency plasma uniformly over a large surface area, including a first and a second power supply section provided on both ends of a discharge electrode to deliver high frequency power, and being installed in a plasma chemical vapor deposition apparatus. The device is characterized by the configuration of a first oscillator that generates high frequency waves at a first frequency; a second oscillator that generates high frequency waves at a second frequency; a high frequency power source A, which upon receiving the high frequency waves from the first oscillator, supplies high frequency power at the first frequency to the first power supply section of the discharge electrode; a frequency switching means that can appropriately switch the first and second frequencies from the first and second oscillators in a predetermined cycle; and a high frequency power source B, which, upon receiving the output from the frequency switching means, supplies the received output to the second power supply section of the discharge electrode; wherein the supply frequency of the high frequency waves supplied to the second power supply section from the high frequency power source B is switched continuously, so as to generate a different plasma by changing a generation position of standing wave and thereby making a uniform plasma, when averaged over time, over a large surface area in the plasma chemical vapor deposition apparatus.

Thus, by alternating cycles of the high frequency power being supplied at the same frequency, and being supplied at different frequencies, when the high frequency waves are supplied to the discharge electrode at the same frequency, the waves coming from both sides resonate in the middle to increase the plasma density in that area, but on the other hand, when the waves from both sides of the electrode are of different frequencies, they tend to cancel each other out at the center to lower the plasma density in that area. Thus when alternating these cycles and looking at the average over time, the generation of the plasma is such that the standing wave distribution is uniform over the large surface area above the discharge electrode, which results in a uniform thickness of deposition on the large surface area substrate, as well as uniform self-cleaning.

A preferred implementation of the foregoing method of this invention is to vary one of the frequencies in the second cycle over time to intentionally vary the state of the plasma generation in a manner such that, when viewed as an average over time, the plasma is generated uniformly over the large surface area, and further, the second oscillator has a variable oscillation frequency.

In this manner, when one of the frequencies of the foregoing second cycle is varied over time in supplying the high frequency waves at different frequencies, the state of plasma generation may be varied accordingly to further average the plasma density.

In addition, one of the frequencies used during the cycle using different frequencies, particularly one of frequencies in the second cycle may be the same frequency as the frequency in the first cycle.

Further, the switching to alternate between the first and second cycles may fall within the range of 1 time/second to 10 million times/second.

The time ratio between the first cycle and the second cycle may be varied, depending on the gas pressure and the type of gas being used.

Also, it is preferable to use a function generator so that the time ratio between the first cycle and the second cycle may be varied, depending on the pressure and the type of the gas being used, and the time ratio between the first and second frequencies that are switched by the switching means may also be varied and set to an appropriate value depending upon the gas pressure and the type of gas based upon inputs into the function generator.

Thus, the time ratio between the first cycle and second cycle may be varied according to the gas pressure and type of gas; for example, using an identical duty cycle, different gas conditions could cause the state of plasma generation to differ. However, such a situation could be handled and a uniform plasma density could be achieved in this manner without requiring any hardware changes.

Further, in the present invention, phase shift modulation may be applied to the high frequency waves supplied to the first or second power supply section during the first cycle to vary the state of plasma generation by shifting the phase from the other high frequency to produce uniform plasma generation over a large surface area when averaged over time.

To wit, further it may comprises a phase shift modulation means which is incorporated to modulate the phase of the high frequency waves supplied from the first oscillator to the high frequency power source A or the frequency switching means.

In this manner, when the same frequency high frequency waves of the same frequency are supplied to the power supply section, the phase of the high frequency waves may be shifted toward the other side to make possible, using a single frequency application to the discharge electrode, to shift the high density plasma off the center and thereby make the plasma uniform when averaged over time.

Further in this invention, a direct current bias may be applied to the power supply section of the discharge electrode in order to uniformize the generated plasma density over a large surface area.

To wit, this involves the addition of a means to apply a direct current bias to the power supply section of the discharge electrode.

The application of the direct current bias to the power supply section of the discharge electrode makes it possible to reduce the sheath capacitance of the discharge electrode, which increases the wavelength of the standing wave to uniformize the plasma density.

Further still in this invention, an axial direction of power supply cables to the first and second power supply sections may be matched to the axial direction of the discharge electrode to minimize the current return distances, and reduce the power loss from the power source, to thereby increase range over which the plasma is generated.

To wit, the power supply cable to the power supply section of the discharge electrode should be connected in a manner such that the axial direction of the cable matches the axial direction of the discharge electrode.

By matching the axial direction of the power source cable to the power supply section to the axial direction of the discharge electrode, the power from the power source can smoothly enter the discharge electrode, and the minimization of the current return distance reduces the power losses to increase the range over which plasma is generated.

Additionally, the present invention is characterized by the configuration, in which gas may be delivered that readily forms plasma to the inside of the plasma chemical vapor deposition apparatus being within a range to satisfy the conditions required for rapid film forming by plasma chemical vapor deposition and rapid self-cleaning of the plasma chemical vapor deposition apparatus.

Adding gas that facilitates plasma formation in this manner further promotes the generation of an uniform plasma. Thus it is preferable to employ gas mixtures that contain inactive gasses such as $N_2$, Ar, Kr, Xe or combinations thereof.

BRIEF DESCRIPTION OF THE DRAWINGS

FIG. 2 is a diagram used to explain a ladder-type structure for the discharge electrode.

FIG. 3 is a diagram showing the connection between the discharge electrode and the power supply cable.

DETAILED DESCRIPTION OF THE PREFERRED EMBODIMENTS

The basic configuration of this invention provides for a plasma chemical vapor deposition apparatus of the class that can accommodate an electrode size of 1.5 m×1.2 m, a gas pressure of 12 to 20 Pa (90–150 mTorr) while utilizing a high frequency power source of 60 MHz. As was described above in section on means used to resolve problems with the existing technology, a first and a second power supply section are established on each end of the discharge electrode in the plasma chemical vapor deposition apparatus; these are powered alternately with high frequency waves in two cycles, a cycle in which the same frequency of high frequency is supplied, and a cycle in which different frequencies of high frequency power are supplied. When viewed over time, the plasma generation, in other words, the standing wave distribution over the discharge electrode, is uniform over the large surface area by the different plasma generation in each cycle. Further, in this present invention, the following six ways can be used to uniformize time-averaged plasma generation to thereby make it possible to work with exceedingly large substrate targets exceeding 1 m×1 m in size.

1. Vary the oscillation frequency of the different frequency over time,
2. Based upon the gas pressure, gas type and other gas conditions, vary the time ratio, in other words, vary the duty cycle between the cycle that supplies the same frequency power to the first and second power supply sections and that which supplies different frequencies,
3. When supplying the same frequency of high frequency power to both the first and second power supply sections, phase shift one of the high frequency power sources with respect to the other,
4. Apply a DC bias voltage to the power supply section of the discharge electrode,
5. Align the axial direction of the power source cable outlet with the first and second power supply sections connections (axial direction), and
6. Input at an appropriate ratio of inactive gas that facilitates plasma generation such as $N_2$, Ar, Kr, Xe or combinations thereof within a range appropriate to the speed of film forming or self-cleaning, etc., in order to uniformize plasma generation over the large surface area and perform uniform processing.

In this section we shall explain several preferred embodiments of this invention with reference to the appended drawings. Whenever the size, materials, shapes, relative positions and other aspects of the parts described in the embodiments are not clearly defined, the scope of the invention is not limited only to the parts shown, which are meant merely for the purpose of illustration.

First, explanation will be provided of the plasma generation device for generating high frequency plasma uniformly over a large surface area in the plasma chemical vapor deposition apparatus of this invention. Thereafter, the methods of generating uniform high frequency plasma over large surface areas will be described.

Figure 1:
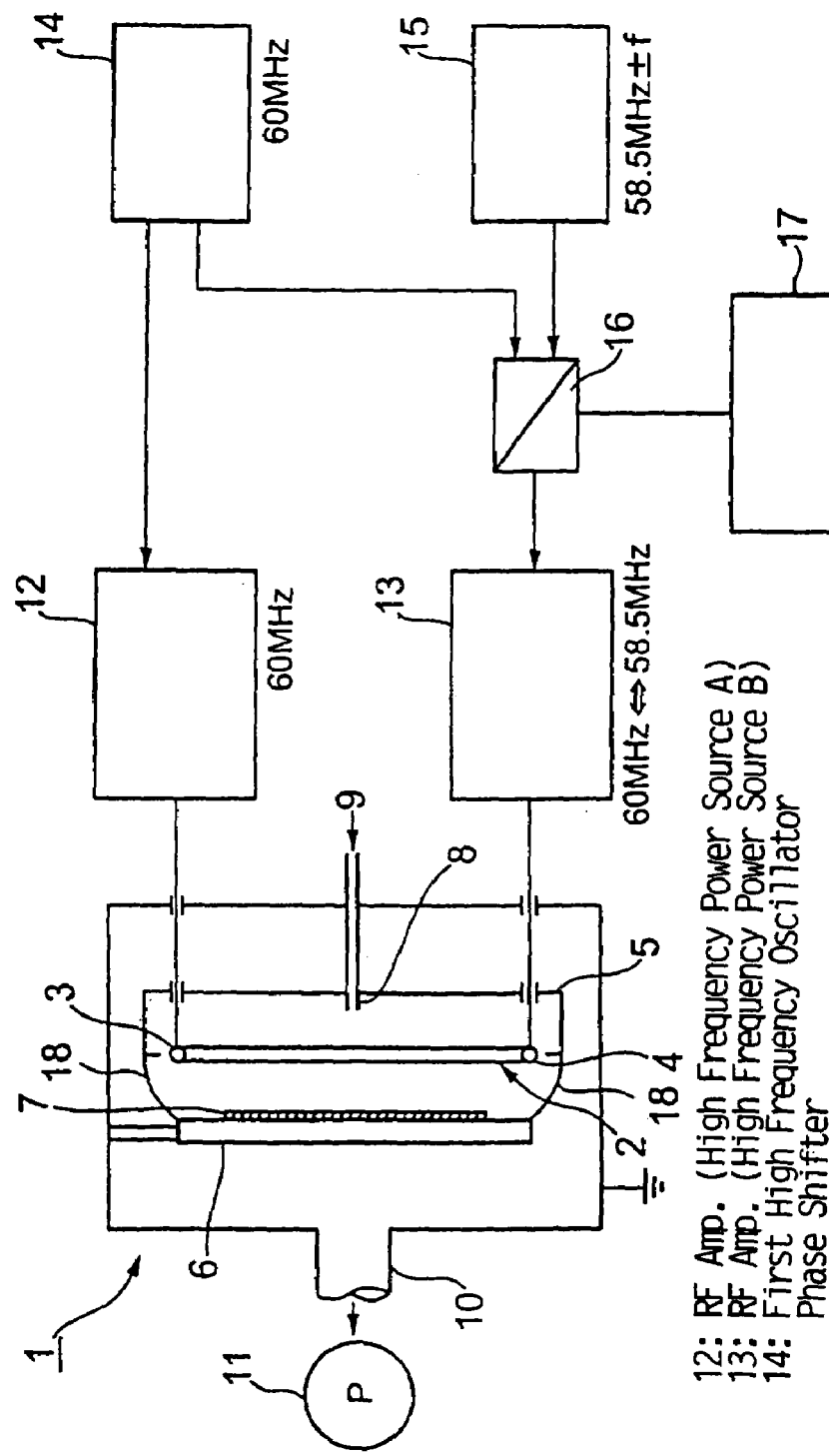
FIG. 1 is a block diagram depicting an embodiment of the plasma generation device for generating high frequency plasma uniformly over a large surface area in the plasma chemical vapor deposition apparatus of this invention.
Figure 4:
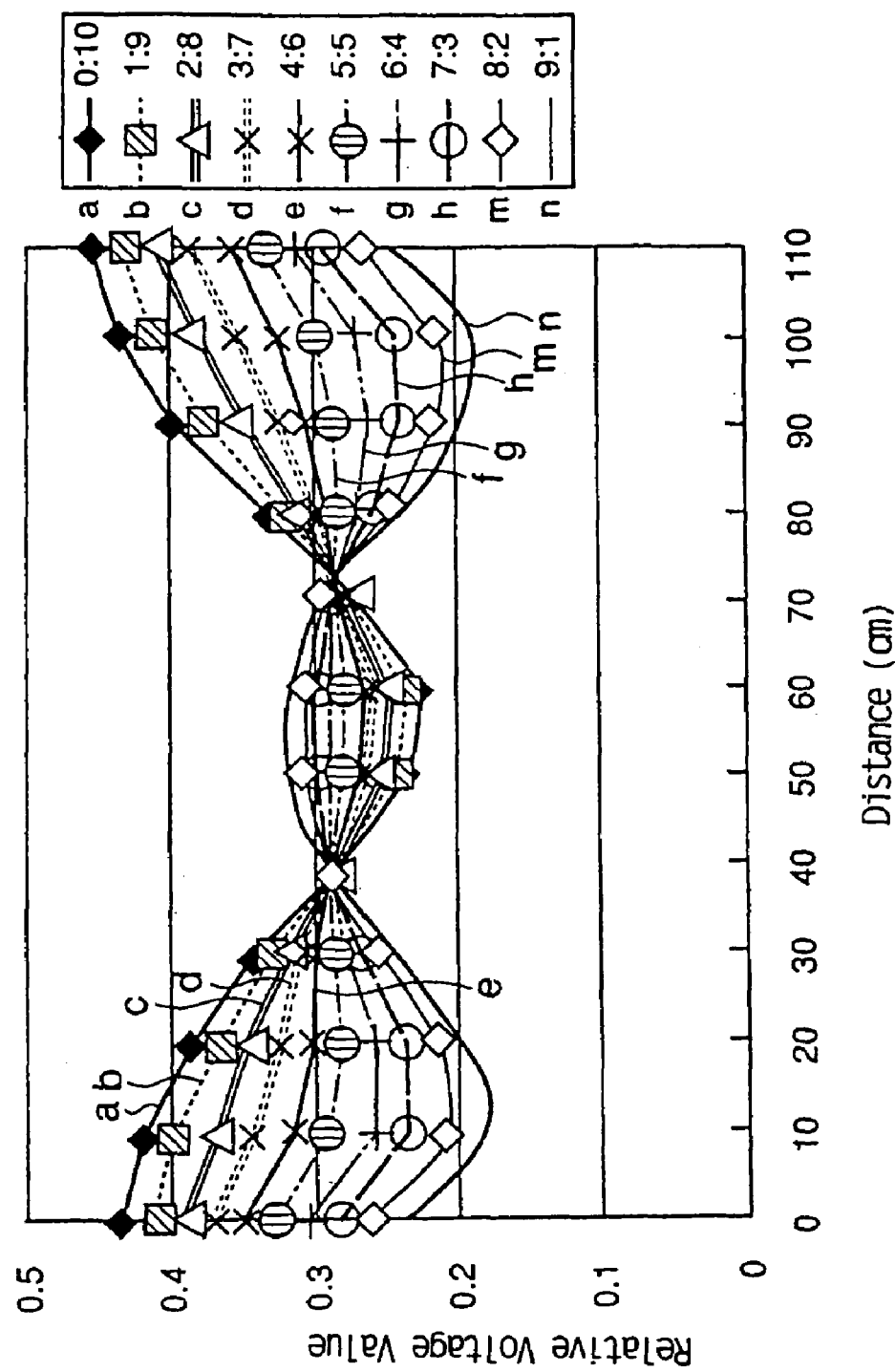
FIG. 4 is a graph showing the plasma generation state using 10 types of cycle ratios that range from 0:10 to 9:1, for the supply of the same frequency of high frequency waves and a different frequency of high frequency waves to the power supply section of the discharge electrode.
Figure 5:
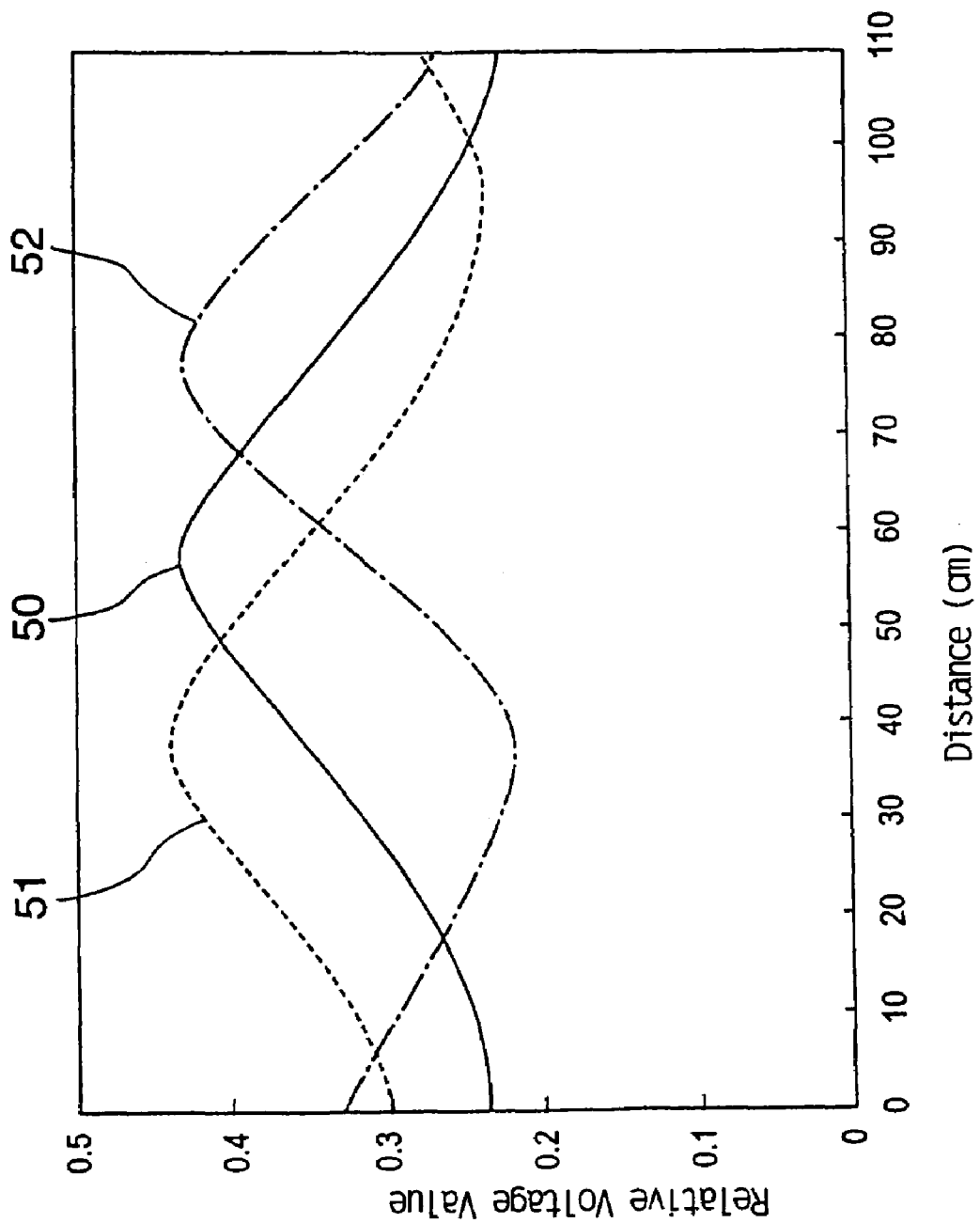
FIG. 5 is a graph showing the phase shift of the one high frequency wave with respect to the other when the same frequency of high frequency power is supplied to the power supply sections.
Figure 6:
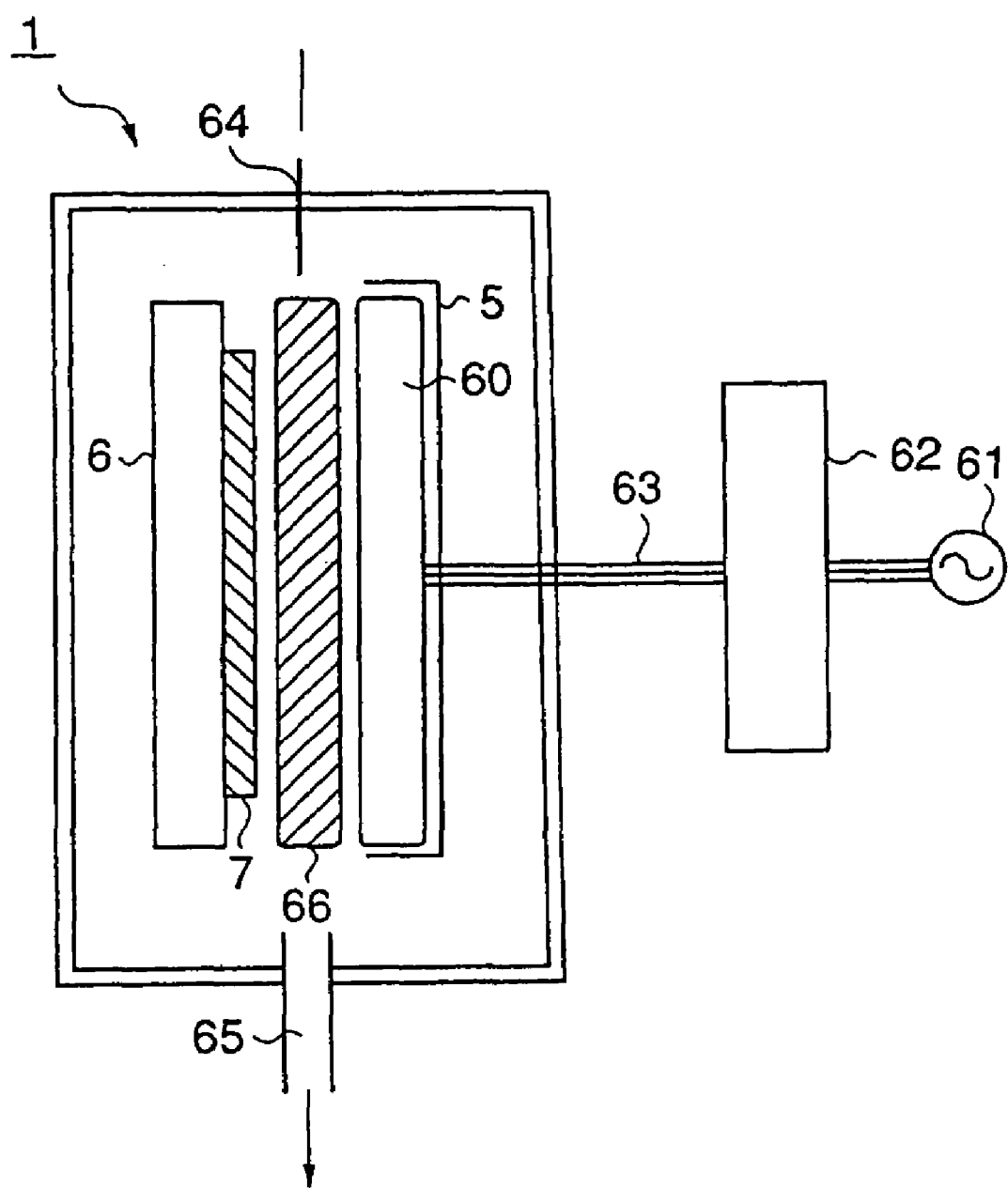
FIG. 6 illustrates an example of a plasma chemical vapor deposition apparatus employing the parallel flat plate type electrode according to the prior art.
Figure 7:
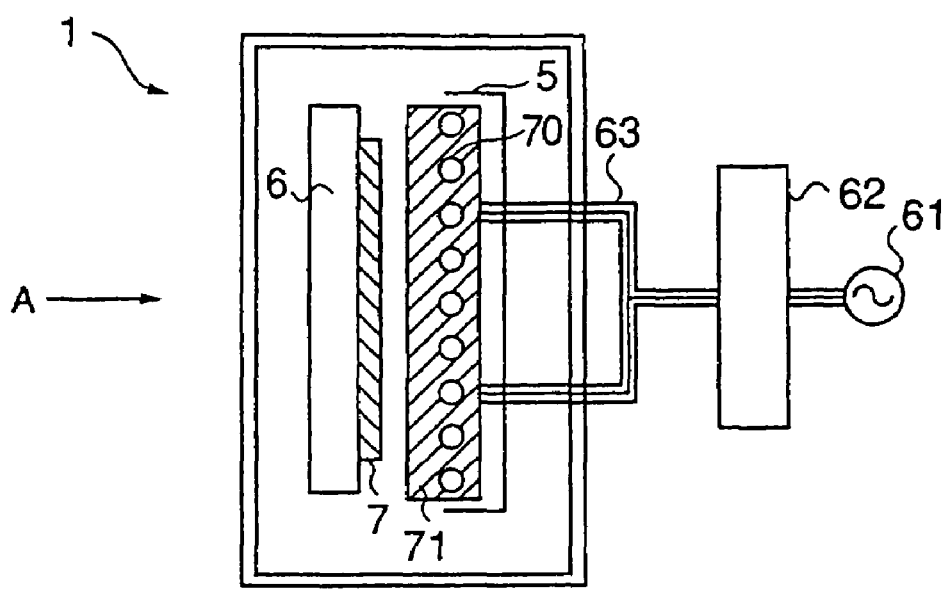
FIG. 7 illustrates an example of a plasma chemical vapor deposition apparatus employing the ladder-type electrode according to the prior art.
Figure 8:
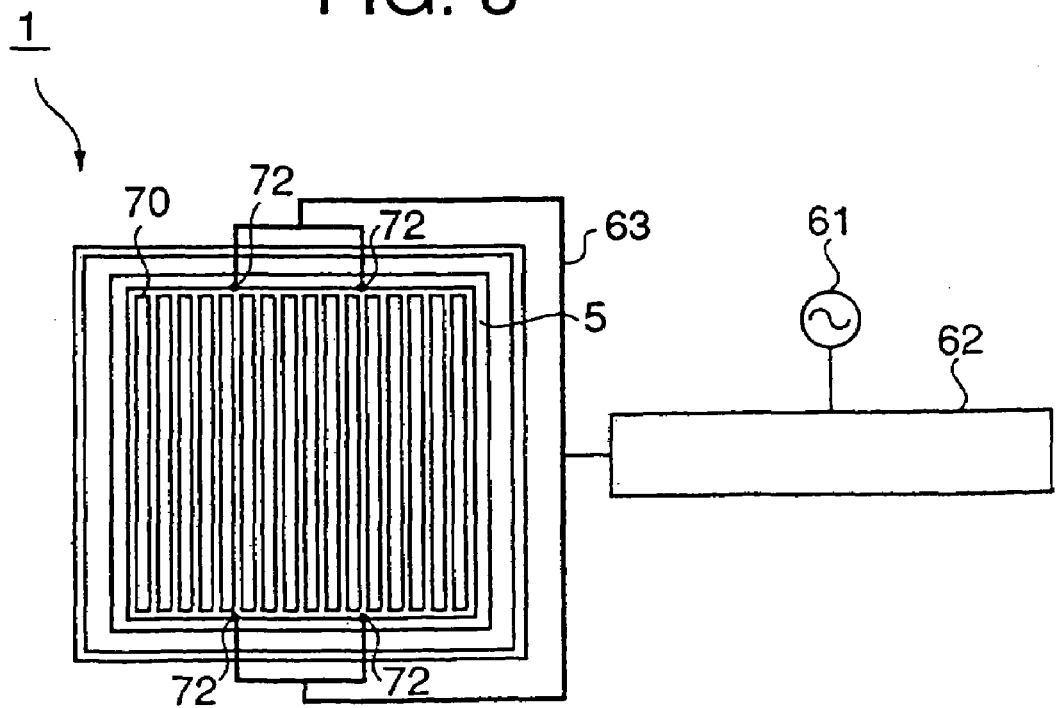
FIG. 8 is a diagram to explain the ladder-type electrode showing from the A side arrowed in FIG. 7 according to the prior art.

FIG. 1 is a block diagram depicting an embodiment of the plasma generation device for generating high frequency plasma uniformly over a large surface area in the plasma chemical vapor deposition apparatus of this invention. FIG. 2 is a diagram used to explain a ladder-type structure for the discharge electrode. FIG. 3 is a diagram showing the power source cable outlet in the axial direction and the aligning of the first and second power supply section connection to match (in the axial direction). FIG. 4 is a graph showing the plasma generation state using 10 types of cycle ratios that range from 0:10 to 9:1, for the supply of the same frequency of high frequency waves and a different frequency of high frequency waves to the power supply section of the discharge electrode. FIG. 5 is a graph showing the phase shift of the one high frequency wave with respect to the other when the same frequency of high frequency power is supplied to the power supply sections.

In FIG. 1, 1 represents a plasma chemical vapor deposition apparatus having an air-tight interior; 2 is the discharge electrode, 3, 4 are the first and second power supply sections for the supply of power to discharge electrode 2; 5 is a ground shield to prevent unwanted plasma formation; 6 is the substrate heating support means which is located, for example, at 20 to 34 mm distance from discharge electrode 2, and which contains an internal heater and mechanism not shown in the figure; 8 is a gas inlet pipe connected to a gas supply source (not shown), which, for example, allows the introduction of reactive gasses 9 such as silane ($SiH_4$) gas for film forming and $NF_3$ for self-cleaning; 10 is a gas exhaust pipe, 11 is a vacuum pump, which enables the internal pressure of the plasma chemical vapor deposition apparatus 1 to be reduced to approximately $1 \times 10^{-6}$ Torr; 12 and 13 are RF amplifiers comprising the first and second high frequency power sources A and B; 14 is a first high frequency (RF) oscillator, which incorporates a phase shifter, to perform phase modulation on either one of the high frequency waves, that oscillates, for example, at 60 MHz to generate the high frequency waves (RF) that are sent to the high frequency power source (RF amp) A and to the switch 16; 15 is a second high frequency (RF) oscillator for 58.5 MHz, which is capable of varying its oscillation frequency, for example, from 58.5 MHz to 59.9 MHz, or from 60.1 MHz to 61.5 MHz; 16 is a switch which can receive the high frequency waves from the first and second high frequency wave oscillators 14, 15 and switch them to supply the high frequency power source B 13; 17 is a function generator which, upon the switching of the high frequency waves from the first and second high frequency oscillators 14, 15, divides up the time cycles, in other words, changes the duty cycle, for these high frequency waves; and 18 is a current return circuit. In FIG. 3, 20 represents a single electrode having a ladder-type structure for use as the discharge electrode 2 in FIG. 1; 21 and 22 are power source cables that supply the high frequency waves to discharge electrode 2 (20); and 23 is the DC bias power source.

Among these, the first high frequency oscillator 14 oscillates, as previously stated, for example, at 60 MHz, and that signal is sent to the high frequency power source A 12 or the switch 16, while the second high frequency oscillator 15, oscillates, for example, at 58.5 MHz and is switched at switch 16. This switch 16, switches the 60 MHz signal sent from the first high frequency oscillator 14 and the 58.5 MHz sent from the second high frequency oscillator 15 in a constant cycle and sends the high frequency to the high frequency power source B 13. Accordingly, the high frequency power source A 12 supplies the 60 MHz high frequency to the first power supply section 3, while the high frequency power source B 13 supplies the 60 MHz and the 58.5 MHz radio frequencies switched at constant cycles to the second power supply section 4.

Further, the switch 16, which switches the 60 MHz from the first high frequency oscillator 14, and the 58.5 MHz from the second high frequency oscillator 15, is such that it can switch at a variable time ratio, in other words, a variable duty cycle based upon a signal from function generator 17 that reflects the gas conditions such as type of gas, pressure, etc. In addition, the first high frequency oscillator 14 incorporates an internal phase shifter which makes possible the phase shifting of the one high frequency with respect to the other frequency that is fed to either high frequency power source A 12 or switch 16. Further, the second high frequency oscillator 15 has a variable configuration to enable it to oscillate, for example, from 58.5 MHz to 59.9 MHz or from 60.1 MHz to 61.5 MHz.

The discharge electrode 2 of plasma chemical vapor deposition apparatus 1, for example, is of the ladder type shown in FIG. 2, and as is shown in the Figure, the first power supply section 3 and the second power supply section 4 are established at 8 points each as shown by the black dots on both ends of discharge electrode 2. Power supply sections 3 and 4 of discharge electrode 2, have connections, 21 and 22 shown in FIG. 3 for each ladder type electrode rungs 20, which are positioned in the same direction (axial direction) as the power supply sections 3, 4. Also, a DC bias can be applied to discharge electrode 2 (20) from DC bias power source 23. In the foregoing description, discharge electrode 2 was of the ladder type, and power supply sections 3, 4 were located at 8 points each, but the present invention is not confined to ladder type discharge electrodes, it may also be applied to flat plate electrodes. Additionally, the connections are not confined to 8 points, there may be 4 points, 16 points, or other number as required by the application.

Thus, by connecting power supply sections 3 and 4 of discharge electrode 2 to the power source cable 21, 22 outlets in a radial direction that matches that of ladder type discharge electrode 20, by introducing the power smoothly into ladder type electrode 20, and by minimizing the current return path distance, power losses at the power supply section may be reduced and the range of plasma generation may be increased. These power cables 21, 22 are coaxial cables or other appropriate types, such as parallel flat cable, or parallel wire cable.

The application of a DC bias from DC bias power source 23 to discharge electrode 2 makes it possible to reduce the sheath capacitance of discharge electrode 2, increase the wavelength of the standing wave in a direction that makes voltage distribution more uniform, and makes possible the averaging of the plasma density. Sheath capacitance refers to the phenomena, in which a surrounding group of electrons (called a "sheath") is formed around a ladder type electrode 20 in the course of plasma generation, and the sheath maintaining a sort of dielectric state prevents direct currents from flowing in a manner similar to the state a capacitor exists around the electrode. The application of a negative DC bias scatters these electrons to thereby reduce the sheath capacitance. This increases the interval between the standing wave wavelengths and serves to make the plasma more uniform.

When employing such a plasma chemical vapor deposition apparatus 1 configured according to this invention to create semiconductor films of a-Si, microcrystal silicon, multicrystal thin film silicon, silicon nitride, etc., or to perform self-cleaning of accumulated a-Si using $NF_3$ gas, during film forming, for example, substrate 7 would be affixed to substrate heating support means 6 which is set at 200° C. while reaction gas 9, such as silane gas ($SiH_4$), would be introduced through gas inlet pipe 8 at a rate, for example, of 50 sccm, with vacuum pump 11 being connected to exhaust pipe 10 to adjust the exhaust flow rate to keep the pressure inside of the plasma chemical vapor deposition apparatus at, for example, 100 mTorr.

Then, for example, the 60 MHz high frequency from the first high frequency oscillator 14, and the 58.5 MHz high frequency from the second high frequency oscillator 15 are respectively supplied to high frequency power source A 12 and switch 16. Then, the operation of switch 16 switches the 60 MHz sent from the first high frequency oscillator 14 and the 58.5 MHz sent from the second high frequency oscillator 15 at a constant cycle and sends the high frequency to the high frequency power source B 13. Then, the high frequency power source A 12 supplies 60 MHz high frequency to the first power supply section 3, while high frequency power source B 13 supplies the 60 MHz and 58.5 MHz radio frequencies that are switch at a constant cycle to the second power supply section 4.

This causes plasma generation between discharge electrode 2 and substrate 7, with the silane ($SiH_4$) or other reaction gas 9 introduced from the gas inlet 8 decomposing and depositing a film of a-Si atop substrate 7. The above described self-cleaning inside of plasma chemical vapor deposition apparatus using the $NF_3$ gas takes place in exactly the same way; the $NF_3$ gas decomposes in a plasma to form fluorine radicals that perform the cleaning.

When the plasma is so generated, FIG. 4 illustrates the differences in plasma states from the case where the 60 MHz very high frequency is supplied simultaneously to power supply sections 3, 4, and the case where the 60 MHz high frequency is supplied to the first power source section 3 while 58.5 MHz, a different high frequency, is supplied to the second power supply section 4. To wit, the graph in FIG. 4 shows the case when silane ($SiH_4$) or other reactant gas 9 is introduced into the foregoing plasma chemical vapor deposition apparatus 1, and the same high frequency (60 MHz) is supplied to the first and second power supply sections 3, 4 of discharge electrode 2, and the case when differing frequencies are supplied (60 MHz to the first power supply section 3 and 58.5 MHz to the second power supply section 4) for 10 sets of conditions with the time ratio being varied from 0:10 to 9:1.

In FIG. 4, the horizontal axis indicates the distance from the first power supply section 3 from (0 cm) to (110 cm) on the right, which corresponds to the distance to the second power supply section 4. The vertical axis shows the relative voltage value for the plasma. The higher this value the more dense the plasma. In the figure the a-curve shows the plasma generation state for the case when the supply time ratio for the different radio frequencies was 10 and that for the same radio frequencies was 0, in other words for the case where different frequencies were used all the time, while the b-curve shows the case for the supply time ratio of the different radio frequencies being 9 and the same frequency being 1. Thereafter, the case is similar for the n-curve, where the time ratio at the different frequencies was 1 and the same frequencies was 9.

As is apparent from this graph, in curve a, when different frequencies were supplied to the first and second power supply sections 3, 4, the plasma density was highest at the two ends of discharge electrode 2, in other words, in the vicinity of the power supply sections 3 and 4, and the plasma density was lowest at the center. However, when the same frequency was supplied to the first and second power supply sections 3, 4 at the highest ratio in curve n, the plasma density was highest near the center of discharge electrode 2, and accordingly, lower toward the vicinity of power supply sections 3 and 4 on each end, but still reasonably high in the vicinity of power supply sections 3, 4. Then, in curve f where the time ratio was 5:5 in supplying the same and different radio frequencies to the first and second power supply sections 3, 4, the cumulative plasma generation state was such that plasma density was slightly higher near the ends of the discharge electrode, but very uniform over a broad range in the center of the electrode.

To wit, the graph of FIG. 4 shows that when the same 60 MHz very high frequency is supplied to both power supply sections 3, 4 of discharge electrode 2, plasma density is higher at the center of the electrode, but when different frequencies are supplied, plasma density is lower at the center of the electrode. By appropriately alternating cycles of the two conditions, it is possible to uniformize plasma generation over a large surface area. Also, similar effects were obtained from the alternation of cycles of the same frequencies with different frequencies to the power supply sections 3, 4 over a broad cycle rate range from 1 cycle to 10 million cycles per second.

The present invention further provides a method for varying the oscillation frequency of the second high frequency oscillator 15 over time from 58.5 MHz to 59.9 MHz or 60.1 MHz to 61.5 MHz. Deliberately varying the frequency in this manner can be used to control the state of plasma generation to obtain an averaged plasma density over time.

In addition, the inclusion of a phase shifter in the first high frequency oscillator 14, makes it possible to shift the phase of the high frequency sent to either high frequency power source A 12 or switch 16 with respect to the phase of the other high frequency. As shown by the solid curve 50 in FIG. 5, the power source is such that the plasma density is highest in the center of discharge electrode 2 when the phase is not shifted, but when the phase is shifted, the position of the high plasma density can be shifted to the areas shown by the broken lines 51, 52, to the left and right. Accordingly, when viewed over time, the plasma density is uniform over a broad area.

Further still, the inclusion of function generator 17 to send the high frequency to switch 16 based upon gas conditions such as gas pressure and the type of gas, makes it possible to vary the time ratios as shown in FIG. 4, in other words, the duty cycle by switch 16 in supplying the high frequency from the first high frequency oscillator 14 and the high frequency from the second high frequency oscillator 15 to high frequency power source 13. So varying the time ratio (duty cycle) for supplying the same radio frequencies, or different radio frequencies to the first and second power supply sections 3, 4 makes it possible to make a variety of changes to the plasma generation state such as are shown in FIG. 4.

This variation of the duty cycle with respect to gas conditions such as gas pressure and type deals with the changes that would otherwise occur in the plasma generation state. When the gas conditions are optimal for electrical discharge, when power is supplied to both ends 3, 4 of the discharge electrode 2, discharges can occur before the power reaches the center of discharge electrode 2, which reduces the relative number of discharges at the center. This would result in the lower plasma density generated in the central area of discharge electrode 2 such as shown in curve a of FIG. 4. In this case, by lengthening the time for power being supplied at the same frequencies, and conversely, by shortening the time at which different radio frequencies are supplied (when plasma density is higher at the center), it is possible to control the plasma density at the central area of the electrode, even with variations in gas conditions such as gas pressure and gas type, to provide even more uniform plasma generation.

In performing the film forming or self-cleaning as described above, even more uniform film forming or self-cleaning can be realized by introducing an appropriate ratio (approximately 0.1 to 25%) of a gas or gas mixture that facilitates uniform plasma generation such as $N_2$, Ar, Kr, Xe or combinations thereof.

In the foregoing descriptions, the embodiments of this invention were each employed individually, but by combining the various methods, it is possible to even further improve effectiveness. An example of combining the embodiments would include, operating switch 16 based on the gas conditions such as gas pressure and gas type to change the duty cycle for the supply of the 60 MHz high frequency from the first high frequency oscillator 14 and the 58.5 MHz high frequency from the second high frequency oscillator 15 in combination with the phase shift of the first high frequency oscillator 14 that is sent to high frequency power source A 12 or switch 16 with respect to the phase of the other high frequency; connecting the power source cables to the power supply sections 3, 4 of discharge electrode 2 in a direction that matches (axially) the first and second power supply sections 3, 4 of ladder type electrode 20 like power source cables 21, 22 in FIG. 3; and applying a DC bias from DC bias power source 23 to discharge electrode 2 (20).

The use of such combinations, that is, controlling the plasma density for uniformization even over differing gas conditions such as gas pressure and gas type, shifting the position of the high density plasma shown by solid line 50 in FIG. 5 to the left and right, as shown by broken lines 51 and 52, minimizing the current return distance by the smooth introduction of the high frequency power to power supply sections 3, 4 of discharge electrode 2 to lower the power loss at the supply sections and expand the range for plasma generation, and increasing the wavelength of the standing wave through the application of a DC bias to discharge electrode 2 to reduce the sheath capacitance and make the voltage distribution more uniform makes it possible to exploit compound effects to better average the plasma density.

This invention, by alternating cycles of supplying the same high frequency power and a different ratio frequency power to the ends of the discharge electrode in a plasma chemical vapor deposition apparatus makes it possible, when viewed over time, to uniformly generate plasma over a large surface area. Further, as described in the foregoing embodiments, this invention makes it possible perform film forming and self-cleaning in a plasma chemical vapor deposition apparatus having an electrode size, for example of 1.5 m×1.2 m at a gas pressure of 12 to 20 Pa (90 to 150 mTorr), using a 60 MHz class high frequency power source by performing the following operations.

1. Vary the oscillation frequency of the different frequency over time.

2. Based upon the gas pressure, gas type and other gas conditions, vary the time ratio, in other words, vary the duty cycle between the cycle that supplies the same frequency power to the first and second power supply sections and that which supplies different frequencies 3. When supplying the same frequency of high frequency power to both the first and second power supply sections, phase shift one of the high frequency power sources with respect to the other.

4. Apply a DC bias voltage to the power supply section of the discharge electrode.

5. Align the axial direction n of the power source cable outlet with the first and second power supply sections connections (axial direction).

6. Input at an appropriate ratio of inactive gas that facilitates plasma generation such as $N_2$, Ar, Kr, Xe or combinations thereof within a range appropriate to the speed of film forming or self-cleaning, etc., in order to uniformize plasma generation over the large surface area and perform uniform processing.

EFFECTS OF THE INVENTION

The plasma chemical vapor deposition apparatus of this invention makes it possible to obtain uniform plasma for high speed, uniform film forming and uniform self-cleaning by means of changing the frequency of the high frequency power, by changing the duty cycle, by modulating the phase, and by applying a DC bias, all without making any hardware changes and even under differing gas conditions such as pressure and flow rate. Accordingly, it delivers impressive results in improving yields on large surface area semiconductor film products and in reducing costs. Further, the ease of making initial adjustments using but few hardware adjustments is greatly effective in reducing operating costs.

The invention claimed is:

1. A plasma generation method for generating high frequency plasma uniformly over a large surface area in a plasma chemical vapor deposition apparatus in which the plasma is generated by supplying high frequency power to a discharge electrode, comprising the steps of:
   applying a first cycle of high frequency power supply to a first and a second power supply section being installed on both ends of a discharge electrode, wherein each high frequency power to said first and said second power supply sections have the same frequency; and
   applying a second cycle of high frequency power supply to said first and said second power supply sections wherein each high frequency power have different frequencies;
   switching continuously and alternatively between said first and said second cycles to apply said same frequency or said different frequencies to said first and said second power supply sections, and so as to generate a different plasma by changing a generation position of standing wave in each cycle, but a uniform plasma when averaged over time.

2. The plasma generation method for generating high frequency plasma uniformly over a large surface area in said plasma chemical vapor deposition apparatus according to claim 1, wherein one of the frequencies in said second cycle varies over time to intentionally vary the state of the plasma generation in a manner such that when viewed as an average over time, the plasma is generated uniformly over the large surface area.

3. The plasma generation method for generating high frequency plasma uniformly over a large surface area in said plasma chemical vapor deposition apparatus according to claim 1 or 2, wherein one of frequencies in said second cycle is the same frequency as the frequency in said first cycle.

4. The plasma generation method for generating high frequency plasma uniformly over a large surface area in said plasma chemical vapor deposition apparatus according to claim 1, wherein said switching to alternate between said first and second cycles falls within the range of 1 time/second to 10 million times/second.

5. The plasma generation method for generating high frequency plasma uniformly over a large surface area in said plasma chemical vapor deposition apparatus according to claim 1, wherein the time ratio between said first cycle and said second cycle is varied, depending on the gas pressure and the type of gas being used.

6. The plasma generation method for generating high frequency plasma uniformly over a large surface area in said plasma chemical vapor deposition apparatus according to claim 1, wherein phase shift modulation is applied to the high frequency waves supplied to said first or second power supply sections during said first cycle to vary the state of plasma generation by shifting the phase from the other high frequency to produce uniform plasma generation over a large surface area when averaged over time.

7. The plasma generation method for generating high frequency plasma uniformly over a large surface area in said plasma chemical vapor deposition apparatus according to claim 1, wherein a direct current bias is applied to said power supply section of said discharge electrode in order to uniformize the generated plasma density over a large surface area.

8. The plasma generation method for generating high frequency plasma uniformly over a large surface area in said plasma chemical vapor deposition apparatus according to claim 1, wherein an axial direction of power supply cables to said first and second power supply sections is matched to the axial direction of said discharge electrode to minimize the current return distances, and reduce the power loss from said power source, to thereby increase range over which the plasma is generated.

9. The plasma generation method for generating high frequency plasma uniformly over a large surface area in said plasma chemical vapor deposition apparatus according to claim 1, wherein gas is delivered that readily forms plasma to the inside of said plasma chemical vapor deposition apparatus being within a range to satisfy the conditions required for rapid film forming by plasma chemical vapor deposition and rapid self-cleaning of the plasma chemical vapor deposition apparatus.

10. The plasma generation method for generating high frequency plasma uniformly over a large surface area in said plasma chemical vapor deposition apparatus according to claim 9, wherein said gas is gas mixtures that contain inactive gasses such as $N_2$, Ar, Kr, Xe or combinations thereof.

11. The plasma generation method for generating high frequency plasma uniformly over a large surface area in said plasma chemical vapor deposition apparatus according to claim 1;
   wherein the time ratio between said first cycle and said second cycle is varied, depending on the gas pressure and the type of gas being used;
   wherein phase shift modulation is applied to the high frequency waves supplied to said first or second power supply section during said first cycle to vary the state of plasma generation by shifting the phase from the other high frequency;

wherein a direct current bias is applied to said power supply section of said discharge electrode; and wherein an axial direction of power supply cables to said first and second power supply sections is matched to the axial direction of said discharge electrode to minimize the current return distances, and reduce the power loss from said power source, to thereby increase range over which the plasma is generated, and produce uniform plasma generation over a large surface area when averaged over time.

12. A plasma generation device for generating high frequency plasma uniformly over a large surface area, including a first and a second power supply section provided on both ends of a discharge electrode to deliver high frequency power, and being installed in a plasma chemical vapor deposition apparatus, said device comprising:

a first oscillator that generates high frequency waves at a first frequency;

a second oscillator that generates high frequency waves at a second frequency;

a high frequency power source A, which upon receiving the high frequency waves from said first oscillator, supplies high frequency power at the first frequency to the first power supply section of said discharge electrode;

a frequency switching means that can appropriately switch said first and second frequencies from said first and second oscillators in a predetermined cycle; and a high frequency power source B, which, upon receiving the output from said frequency switching means, supplies said received output to said second power supply section of said discharge electrode;

wherein the supply frequency of said high frequency waves supplied to said second power supply section from said high frequency power source B is switched continuously by the frequency switching means, so as to generate a different plasma by the frequency difference between said first and second frequencies and thereby making a uniform plasma, when averaged over time, over a large surface area in said plasma chemical vapor deposition apparatus.

13. The plasma generation device for generating high frequency plasma uniformly over a large surface area, which is installed in a plasma chemical vapor deposition apparatus according to claim 12, wherein said second oscillator has a variable oscillation frequency.

14. The plasma generation device for generating high frequency plasma uniformly over a large surface area, which is installed in a plasma chemical vapor deposition apparatus according to claim 12, further comprising a function generator which varies the time ratio between the first cycle and the second cycle switched by the frequency switching means, and sets to an appropriate value depending upon the gas pressure and the type of gas based upon inputs into said function generator.

15. The plasma generation device for generating high frequency plasma uniformly over a large surface area, which is installed in a plasma chemical vapor deposition apparatus according to claim 12, further comprising a phase shift modulation means which is incorporated to modulate the phase of the high frequency waves supplied from said first oscillator to said high frequency power source A or said frequency switching means.

16. The plasma generation device for generating high frequency plasma uniformly over a large surface area, which is installed in a plasma chemical vapor deposition apparatus according to claim 12, further comprising a means to apply a direct current bias to the power supply section of said discharge electrode.

17. The plasma generation device for generating high frequency plasma uniformly over a large surface area, which is installed in a plasma chemical vapor deposition apparatus according to claim 12, wherein the power supply cable to the power supply section of said discharge electrode is connected in a manner such that the axial direction of the cable matches the axial direction of the discharge electrode.

18. The plasma generation device for generating high frequency plasma uniformly over a large surface area, which is installed in a plasma chemical vapor deposition apparatus according to claim 12, wherein said first and second power supply sections are installed on both ends of said discharge electrode.

19. The plasma generation device for generating high frequency plasma uniformly over a large surface area, which is installed in a plasma chemical vapor deposition apparatus according to claim 12, further comprising;

a function generator which varies the time ratio between the first cycle and the second cycle switched by the frequency switching means, and sets to an appropriate value depending upon the gas pressure and the type of gas based upon inputs into said function generator;

a phase shift modulation means which is incorporated to modulate the phase of the high frequency waves supplied from said first oscillator to said high frequency power source A or said frequency switching means; and a means to apply a direct current bias to the power supply section of said discharge electrode;

wherein the power supply cable to the power supply section of said discharge electrode is connected in a manner such that the axial direction of the cable matches the axial direction of the discharge electrode.

* * * * *